(12) United States Patent
Yang et al.

(10) Patent No.: US 6,670,715 B2
(45) Date of Patent: Dec. 30, 2003

(54) BILAYER SILICON CARBIDE BASED BARRIER

(75) Inventors: Neng-Hui Yang, Hsin-Chu (TW); Cheng-Yuan Tsai, Yun-Lin Hsien (TW); Hsin-Chang Wu, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 57 days.

(21) Appl. No.: 09/683,245

(22) Filed: Dec. 5, 2001

(65) Prior Publication Data

US 2003/0102491 A1 Jun. 5, 2003

(51) Int. Cl.[7] .............................................. H01L 23/48
(52) U.S. Cl. ........................ 257/760; 438/624; 438/627; 438/637; 438/638; 438/687
(58) Field of Search .................................. 438/687, 624, 438/627, 637, 638

(56) References Cited

U.S. PATENT DOCUMENTS 6,503,835 B1 * 1/2003 Lee .............................. 438/687

FOREIGN PATENT DOCUMENTS

EP        1186685 A2 *  8/2001  ........... C23C/16/32

* cited by examiner

Primary Examiner—David Nelms
Assistant Examiner—Mai-Huong Tran
(74) Attorney, Agent, or Firm—Winston Hsu

(57) ABSTRACT

A bilayer SiC-based barrier is formed over a metallic wiring layer and a first dielectric layer. The bilayer SiC-based barrier consists of a nitrogen-doped SiC bottom layer and an oxygen-doped SiC top layer. The nitrogen-doped SiC bottom layer has a minimum thickness to prevent metal atoms of the metallic wiring layer from diffusing out to a second dielectric layer and, at the same time, avoid oxygen atoms of the oxygen-doped SiC top layer from diffusing into the metallic wiring layer.

18 Claims, 1 Drawing Sheet

BILAYER SILICON CARBIDE BASED BARRIER

BACKGROUND OF THE INVENTION

1. Field of the Invention

The present invention relates to an integrated circuit, and more particularly, to a bilayer silicon carbide (SiC) barrier for interconnect metallization applications.

2. Description of the Prior Art

As a demand for faster device speeds continues to increase, fabrication and design engineers have been implementing lower dielectric constant materials. Typically, the speed of an interconnect structure is characterized in terms of RC (resistance/capacitance) delays. The lower dielectric constant materials help in reducing inter-metal capacitance, and therefore, reduce RC delays and improve device speeds.

Dual damascene processes are world widely used interconnect metallization techniques applying in high-speed logic devices of design rules below 0.25 micrometers. In dual-damascene applications, interconnect metallization lines are formed in trenches of dielectric layers and are formed of copper (Cu). In addition to the interconnect metallization lines, the dual-damascene structures further comprises via plugs to electrically connect the metallization lines with other conductive layers. As known to those skilled in the art, the conventional dual damascene techniques include: (1) a via-first process, (2) a self-aligned process, and (3) a trench-first process.

No matter which fabrication process of the above-mentioned dual damascene techniques is chosen, a barrier layer is finally deposited on the metal layer filling in the trench. The barrier layer is used to prevent outward migration of metals and prevent oxidation of metals. Normally, silicon nitride is used to form the barrier layer. However, silicon nitride has a great dielectric constant (>6.5) and thus reduces operating speeds of the interconnect metallization lines. In order to improve the operating speeds of the interconnection metallization lines, Furumura et al. (U.S. Pat. No. 5,103,285) use silicon carbide (SiC) to form a barrier layer between a silicon substrate and a metal wire, the SiC barrier layer having a low dielectric constant of about 4–5. Mark et al. (U.S. Pat. No. 5,818,071) use amorphous SiC (a-SiC) to form a barrier layer between a metal wire and a dielectric layer, preventing diffusion of metal atoms from the metal wire to the dielectric layer.

The SiC barrier layer has a lower dielectric constant compared to the conventional silicon nitride barrier layer, however, the SiC barrier layer still has some disadvantages, such as (1) low breakdown voltages, (2) high leakage currents, and (3) unstable film properties. Therefore, using low dielectric constant materials to form a barrier layer and simultaneously prevent the above-mentioned problems has become an important issue.

SUMMARY OF THE INVENTION

It is therefore an objective of the present invention to provide an interconnect metallization line with high performance and high reliability.

It is another objective of the present invention to provide a bilayer SiC-based barrier layer to prevent the above-mentioned problems.

An integrated circuit of the present invention substantially includes at least one metallic wiring layer damascened on a first dielectric layer, a bilayer SiC-based barrier deposited over the metallic wiring layer and the first dielectric layer, and a second dielectric layer formed over the bilayer SiC-based barrier.

The bilayer SiC-based barrier has a nitrogen-doped SiC bottom layer and an oxygen-doped SiC top layer formed by an in-situ deposition over the nitrogen-doped SiC bottom layer. The nitrogen-doped SiC bottom layer has a minimum thickness to prevent metal atoms of the metallic wiring layer from diffusing to the second dielectric layer and, at the same time, avoid oxygen atoms of the oxygen-doped SiC top layer from diffusing into the metallic wiring layer.

These and other objectives of the present invention will no doubt become obvious to those of ordinary skill in the art after reading the following detailed description of the preferred embodiment that is illustrated in the multiple figures and drawings.

Figure 1:
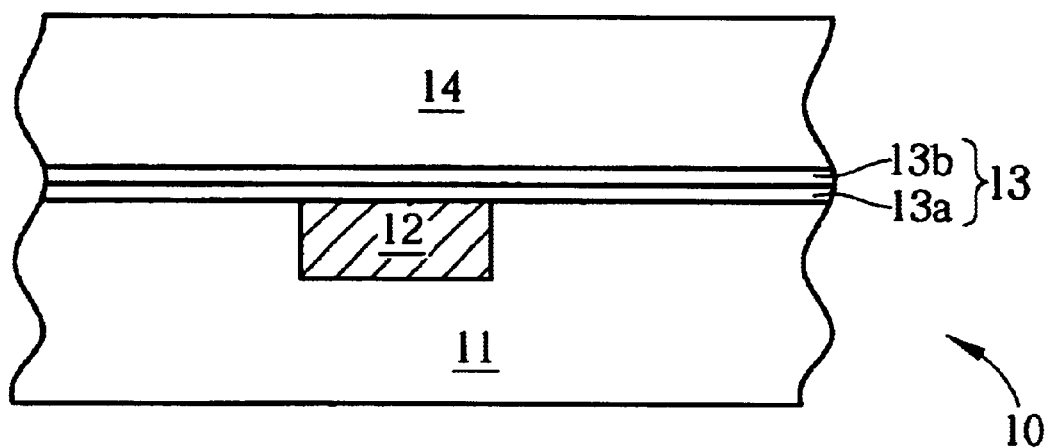
FIG. 1 is a cross-sectional diagram of an interconnect metallization according to the present invention.

Table. 1 illustrates electrical properties of a bilayer SiC-based barrier (120 Å $SiN_xC_y$+380 Å $SiO_xC_y$) compared to a single-layer SiC barrier (500 Å SiC).

DETAILED DESCRIPTION

The present invention utilizes a bilayer SiC-based film as a barrier of an interconnect metallization. The bilayer SiC-based film consists of a nitrogen-doped SiC ($SiN_xC_y$) bottom layer and an oxygen-doped SiC ($SiO_xC_y$) top layer. The nitrogen-doped SiC bottom layer has perfect electrical properties, such as high breakdown voltages and low leakage currents. The oxygen-doped SiC top layer has high breakdown voltages and perfect film stability. Thus, the bilayer barrier of the present invention has the combining advantages of these two layers of high breakdown voltages, low leakage currents, and film stability. In addition, while comparing the bilayer barrier of the present invention to the conventional single-layer SiC barrier, the bilayer SiC has better mechanical properties.

Using the nitrogen-doped SiC layer only or using the oxygen-doped SiC layer only to form the barrier has some disadvantages. When the barrier is composed of the nitrogen-doped SiC layer only, nitrogen atoms of the barrier form amine to react with deep UV photo resist to cause photo resist footing. When the barrier is composed of oxygen-doped SiC layer only, oxygen atoms of the barrier diffuse into the metallic wiring layer to oxide metallic wiring lines. Therefore, the present invention utilizes the nitrogen-doped SiC layer as the bottom layer of the barrier and utilizes the oxygen-doped SiC layer as the top layer of the barrier, thus forming the bilayer barrier to improve film stability of the oxygen-doped SiC layer and prevent metal atoms of the metallic wiring layer from diffusing out to the dielectric layer and, at the same time, avoid oxygen atoms of the oxygen-doped SiC layer from diffusing into the metallic wiring layer.

Please refer to FIG. 1 of a cross-sectional of an interconnect metallization 10 according to the present invention. As shown in FIG. 1, the interconnect metallization 10 has a first dielectric layer 11. A metallic wiring layer 12 is formed in the first dielectric layer 11. A bilayer SiC-based barrier 13 is deposited over the metallic wiring layer 12 and the first dielectric layer 11. Finally, a second dielectric layer 14 is formed over the bilayer SiC-based barrier 13. The bilayer SiC-based barrier 13 consists of a nitrogen-doped SiC bottom layer 13a and an oxygen-doped SiC top layer 13b. Wherein, the nitrogen-doped SiC bottom layer 13a has a minimum thickness to prevent diffusion of metal atoms from the metallic wiring layer 12 to the second dielectric layer 14 and prevent diffusion of oxygen atoms from the oxygen-doped SiC top layer 13b to the metallic wiring layer 12 as well. In other embodiments of the present invention, the second dielectric layer 14 further comprises a metallic wiring layer (not shown), functioning as a via plug, penetrating through the bilayer SiC-based barrier 13 to electrically connect to the bottom metallic wiring layer 12.

A method of forming the metallic wiring layer 12 in the first dielectric layer 11 includes a via-first fabrication process, a partial-via fabrication process, a self-aligned fabrication process, a trench-first fabrication or other interconnect metallization damascene fabrication process. The techniques of forming the damascene metallic wiring layer are introduced in U.S. Pat. No. 6,197,681, Forming copper interconnects in dielectric materials with low constant dielectrics, by Liu et al., and in U.S. Pat. No. 6,004,188, Method for forming copper damascene structure by using a dual CMP barrier layer, by Roy et al.

The first dielectric layer 11 and the second dielectric layer 14 are made of fluorinated silicon glass (FSG), hydrogen silsesquioxane (HSQ), methyl silsesquioxane (MSQ), black diamond materials, Coral, porous silica, amorphous fluorocarcon polymers, fluorinated polyimide, PTFE, poly(arylene ether), benzocyclobutene, SiLK™ or FLARE™. In the preferred embodiment of the present invention, a dielectric constant of the first dielectric layer 11 and the second dielectric layer 14 is less than 3.2. The metallic wiring layer 12 is made of copper using a physical vapor deposition (PVD), an electroplating, a sputtering or an electron beam evaporation.

In the preferred embodiment, both the nitrogen-doped SiC bottom layer 13a and the oxygen-doped SiC top layer 13b of the bilayer SiC-based barrier 13 are deposited by using a plasma-enhanced chemical vapor deposition (PECVD) process. Wherein, the nitrogen-doped SiC bottom layer 13a and the oxygen-doped SiC top layer 13b are formed in the same PECVD chamber by an in-situ deposition. Parameters of the CVD process, such as gases, operating pressure, temperature and reacting time can be adjusted according to machine types or process designs.

Some examples of the parameter ranges for depositing the nitrogen-doped SiC bottom layer 13a are listed below: a $NH_3$ flow rate ranging from 1000 to 1300 standard cubic centimeters per minute (sccm), the $NH_3$ flow rate having a preferred value of 1200 sccm; a nitrogen gas flow rate ranging from 1000 to 1300 sccm, the nitrogen gas flow rate having a preferred value of 1200 sccm; a 4-methylsilane $(Si(CH_3)_4)$ flow rate ranging from 1200 to 1600 sccm, the $(Si(CH_3)_4)$ flow rate having a preferred value of 1400 sccm; a high frequency radio frequency (HFRF) of about 1450 watts; a low frequency radio frequency (LFRF) of about 300 watts; an operating pressure of about 4 torr and an temperature of about 400° C.

In order to avoid the metal atoms of the metallic wiring layer 12 from diffusing out to the second dielectric layer 14 and, at the same time, avoid oxygen atoms of the oxygen-doped SiC top layer 13b from diffusing into the metallic wiring layer 12, the nitrogen-doped SiC bottom layer 13a has the minimum thickness of about 100 angstroms (Å), and 120 Å is a preferred thickness of the bottom layer 13a. In other embodiments of the present invention, methylsilane $(Si(CH_3)H_3)$, 2-methylsilane $(Si(CH_3)_2H_2)$, or 3-methylsilane $(Si(CH_3)_3H)$ can be used as a precursor gas to form the bottom layer 13a.

The nitrogen-doped SiC bottom layer 13a and the oxygen-doped SiC top layer 13b are formed in the same PECVD chamber. In other words, after depositing the nitrogen-doped SiC bottom layer 13a, the oxygen-doped SiC top layer 13b is in-situ deposited over the nitrogen-doped SiC bottom layer 13a. Parameter ranges of depositing the oxygen-doped SiC top layer 13b are listed below: a $Si(CH_3)_3H$ flow rate of about 600 sccm; an oxygen gas flow rate of about 30 sccm; a HFRF of about 150 watts; an operating pressure ranging from 0.5 to 5 torr, the operating pressure having a preferred value of 2 torr; a temperature ranging from 350 to 450° C., the temperature having a preferred value of 400° C. In other embodiments of the present invention, $Si(CH_3)H_3$, $Si(CH_3)_2H_2$ or $Si(CH_3)_3H$ can be used as the precursor gas to form the top layer 13b.

TABLE 1

|  | Bilayer SiC barrier (120 Å $SiN_xC_y$ + 380 Å $SiO_xC_y$) | Single layer SiC barrier (500 Å SiC) |
|---|---|---|
| Dielectric constant (k) | 4.2 | 4.5 |
| Breakdown voltage (MV/cm) | 4.0 | 2.5 |
| Current leakage (@ 1 MV/cm) | 1.7E-9 | 2E-8 |

Please refer to Table. 1 of electrical properties a bilayer SiC-based barrier with components of 120 Å $SiN_xC_y$ and 380 Å $SiO_xC_y$. In Table. 1, the bilayer SiC-based barrier is compared with a single layer SiC-based barrier having a thickness the same as the thickness of the bilayer SiC-based barrier. As shown in Table. 1, the bilayer SiC-based barrier has a dielectric constant of about 4.2, a breakdown voltage of about 4.0 MV/cm and a leakage current of about 1.7E-9 A/cm². The single layer SiC-based barrier has a dielectric constant of about 4.5, a breakdown voltage of about 5.5 MV/cm and a leakage current of about 2.0E-8 A/cm². Therefore, the bilayer SiC-based barrier has better electrical properties than the single layer SiC-based barrier.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. An integrated circuit comprising:
at least one metallic wiring layer damascened on a first dielectric layer;
a multi-layer SiC-based barrier having a nitrogen-doped SiC layer and an oxygen-doped SiC layer deposited over the metallic wiring layer and the first dielectric layer; and
a second dielectric layer formed over the multi-layer SiC-based barrier.

2. The integrated circuit according to claim 1 wherein the metallic wiring layer is made of copper.

3. The integrated circuit according to claim 1 wherein the multi-layer SiC-based barrier is a bilayer SiC-based barrier.

4. The integrated circuit according to claim 1 wherein the oxygen-doped SiC layer is deposited over the nitrogen-doped SiC layer.

5. The integrated circuit according to claim 1 wherein a thickness of the nitrogen-doped SiC layer is greater than or equal to 100 angstroms.

6. The integrated circuit according to claim 1 wherein the multi-layer SiC-based barrier is deposited by using a plasma-enhanced chemical vapor deposition (PECVD) process.

7. The integrated circuit according to claim 1 wherein the nitrogen-doped SiC layer and the oxygen-doped SiC layer are formed in one PECVD chamber.

8. The integrated circuit according to claim 1 wherein both of the first dielectric layer and the second dielectric layer have a dielectric constant of less than about 3.2.

9. The integrated circuit according to claim 1 wherein the first dielectric layer is formed by using a chemical vapor deposition (CVD) process.

10. The integrated circuit according to claim 9 wherein the first dielectric layer is made from a methylsilane precursor.

11. The integrated circuit according to claim 10 wherein the methylsilane precursor is selected from a group consisting of methylsilane $(Si(CH_3)H_3$, 2-methylsilane $(Si(CH_3)_2H_2)$, and 3-methylsilane $(Si(CH_3)_3H)$.

12. An integrated circuit comprising:
   at least one metallic wiring layer damascened on a first dielectric layer;
   a bilayer SiC-based barrier deposited over the metallic wiring layer and the first dielectric layer; and
   a second dielectric layer formed over the bilayer SiC-based barrier;
   wherein the bilayer SiC-based barrier consists of a nitrogen-doped sic bottom layer having a minimum thickness and an oxygen-doped SiC top layer that is in-situ deposited over the bottom undoped SiC layer, and wherein the nitrogen-doped SiC bottom layer can prevent atoms of the metallic wiring layer from diffusing out to the second dielectric layer and, at the same time, avoid oxygen of the oxygen-doped SiC top layer from diffusing into the metallic wiring layer.

13. The integrated circuit according to claim 12 wherein the metallic wiring layer is made of copper.

14. The integrated circuit according to claim 12 wherein the minimum thickness of the nitrogen-doped SiC bottom layer is 100 angstoms.

15. The integrated circuit according to claim 12 wherein the bilayer SiC-based barrier is deposited by using a plasma-enhanced chemical vapor deposition (PECVD) process.

16. The integrated circuit according to claim 12 wherein the first dielectric layer is formed by using a chemical vapor deposition (CVD) process.

17. The integrated circuit according to claim 16 wherein the first dielectric layer is made from a methylsilane precursor.

18. The integrated circuit according to claim 17 wherein the methylsilane precursor is selected from a group consisting of methylsilane $(Si(CH_3)H_3)$, 2-methylsilane $(Si(CH_3)_2H_2)$, and 3-methylsilane $(Si(CH_3)_3H)$.

* * * * *